United States Patent [19]

Abe et al.

[11] Patent Number: 4,956,607
[45] Date of Patent: Sep. 11, 1990

[54] METHOD AND APPARATUS FOR OPTICALLY MEASURING ELECTRIC CURRENT AND/OR MAGNETIC FIELD

[75] Inventors: Masanori Abe, Tokyo; Syunzo Mase, Tobishima; Yoshinari Kozuka, Nagoya, all of Japan

[73] Assignee: NGK Insulators, Ltd., Japan

[21] Appl. No.: 314,108

[22] Filed: Feb. 23, 1989

[30] Foreign Application Priority Data

Mar. 3, 1988 [JP] Japan .................................. 63-50117

[51] Int. Cl.$^5$ .................... G01R 33/032; G01R 19/00
[52] U.S. Cl. ...................................... 324/244; 324/96
[58] Field of Search ........................ 324/96, 244, 260; 350/375–378; 250/225, 231 R

[56] References Cited

U.S. PATENT DOCUMENTS

| | | | |
|---|---|---|---|
| 4,539,521 | 9/1985 | Matsumoto | 324/244 |
| 4,563,646 | 1/1986 | Desormiere | 324/244 |
| 4,683,421 | 7/1987 | Miller et al. | 324/96 |
| 4,774,406 | 9/1988 | Chollet et al. | 324/96 X |

FOREIGN PATENT DOCUMENTS

| | | | |
|---|---|---|---|
| 57-184974 | 11/1982 | Japan | 324/260 |
| 58-27071 | 2/1983 | Japan | 324/260 |

61-66169 4/1986 Japan .

Primary Examiner—Gerard R. Strecker
Attorney, Agent, or Firm—Arnold, White & Durkee

[57] ABSTRACT

A system for optically measuring the strength of an AC magnetic field, by an apparatus which includes a sensing head having a magnetooptical element, a polarizer and an analyzer, a light source device for producing a light beam to be transmitted through the sensing head, and a light-sensitive device for converting an optical output of the sensing head into an electric signal. The light beam is modulated by the sensing head to provide the optical output indicative of the strength of the AC magnetic field to which the magnetooptical element is exposed. The magnetooptical element is exposed also to a reference magnetic field different from the AC magnetic field, to thereby bias the light beam while being transmitted through the magnetooptical element. A first and a second component ($E\omega$) and ($E_{2\omega}$) of the electric signal is produced by the light-sensitive device. The first component ($E\omega$) has the same angular frequency as that of the AC magnetic field, while the second component ($E_{2\omega}$) has an angular frequency which is two times that of the AC magnetic field. The strength of the AC magnetic field is determined based on the first and second components ($E\omega$) and ($E_{2\omega}$).

11 Claims, 2 Drawing Sheets

METHOD AND APPARATUS FOR OPTICALLY MEASURING ELECTRIC CURRENT AND/OR MAGNETIC FIELD

BACKGROUND OF THE INVENTION

1. Field of the Invention

The present invention relates to a method and an apparatus for optically measuring or determining an amount of an electric current or strength of a magnetic field, by utilizing the Faraday effect. More particularly, the invention is concerned with such method and apparatus for measuring an amount of electric current which flows through an electrically conductive material such as electric power transmission or distribution lines.

2. Discussion of the Prior Art

In the art of measuring the strength of a magnetic field, a technique utilizing the Faraday effect, i.e., a magnetooptical effect, is drawing an increasing attention of the industries concerned. This technique uses a light beam as a medium for the measurement, and consequently, assures a high degree of insulation from electromagnetic induction noises. Application of this feature has been proposed to measure an electric current which produces a magnetic field.

Such a magnetooptical technique which utilizes the Faraday effect is generally practiced by an apparatus which includes a magnetooptical sensing head having a Faraday-effect element or magnetooptical element, a polarizer and an analyzer, a light source device for generating a light beam to which the sensing head is exposed, and a light-sensitive means for converting an optical output of the sensing head into an electric signal. The sensing head modulates the incident light beam according to the strength of a magnetic field to which the sensing head is exposed. The thus modulated light beam is received by the light-sensitive means.

In the apparatus indicated above, the light beam produced by the light source device is linearly polarized by the polarizer of the sensing head, and the linearly polarized light beam is transmitted through the magnetooptical or Faraday element in the magnetic field. As a result, the plane of polarization of the linearly polarized light beam is rotated as a function of the magnetic field strength, due to the Faraday effect. The light beam whose polarization plane is rotated by the magnetooptical element is incident upon the analyzer which has a polarizing direction different from that of the polarizer, whereby the angle of rotation of the polarization plane is converted into the amount of light which has passed through the analyzer. In other words, a change in the optical output of the sensing head corresponds to a change in the strength of the magnetic field to which the sensing head is exposed. As is well known in the art, the optical output of the sensing head is expressed by a formula which includes the Verdet's constant. According to this formula, the strength of the magnetic field, and the amount of electric current which gives that magnetic field strength, may be determined.

However, it is recognized that the magnetooptical current/magnetic field measuring apparatus utilizing the Faraday effect suffers from a potential problem that the output signal level is influenced by a change in the environments of the apparatus. For instance, the above-indicated formula used to determine the magnetic field strength from the optical output includes the Verdet's constant of the material of the magnetooptical element (Faraday-effect element) which has a certain degree of temperature dependence. While various solutions to this problem have been considered and proposed, none of them have been found satisfactory or sufficiently effective to solve the problem, and some of the proposed solutions require a complicated arrangement or result in an increase in the size of the apparatus. Thus, the proposed solutions are not practically available.

SUMMARY OF THE INVENTION

It is therefore an object of the present invention to provide a method and an apparatus for optically measuring an electric current/magnetic field strength, with high and consistent accuracy, without its output signal level being influenced by the operating environments.

Another object of the invention is to provide an optical measuring system which is relatively simple in construction and which is suitably adapted to compensate for the temperature dependence of a magnetooptical element.

According to one aspect of the present invention, there is provided a method of optically measuring the strength of an AC magnetic field, by a measuring apparatus which includes a magnetooptical sensing head having at least a magnetooptical element, a polarizer and an analyzer, a light source device for producing a light beam to which the sensing head is exposed, and light-sensitive means for converting an optical output of the sensing head into an electric signal, the light beam being modulated into the optical output by the sensing head, according to the strength of the AC magnetic field to which the magnetooptical element is exposed, comprising the steps of: (a) exposing the magnetooptical element of the sensing head to a reference magnetic field different from the AC magnetic field, to thereby bias the light beam while the light beam is transmitted through the magnetooptical element; (b) retrieving a first component ($E\omega$) and a second component ($E_{2\omega}$) of the electric signal which is produced by the light-sensitive means, the first component ($E\omega$) having a same angular frequency as that of the Ac magnetic field, while the second component ($E_{2\omega}$) having an angular frequency which is two times that of the AC magnetic field; and (c) determining the strength of the AC magnetic field, based on the first and second components ($E\omega$) and ($E_{2\omega}$).

In the method of this invention as described above, a light beam is modulated by the magnetooptical element or Faraday-effect element according to the strengths of the AC and reference magnetic fields to which the magnetooptical element is exposed, while the light beam is transmitted or propagated through the magnetooptical element. The thus obtained optical output of the sensing head is converted into a corresponding electric signal which has a first component ($E\omega$) having the same angular frequency as that of the AC magnetic field, and a second component ($E_{2\omega}$) having an angular frequency two times that of the AC magnetic field. The strength of the AC magnetic field, and the amount of an electric current which gives this AC magnetic field may be determined based on the retrieved first and second components ($E\omega$) and ($E_{2\omega}$), without being influenced by the Verdet's constant of the magnetooptical element, and variations in the amount of light produced by the light source device and the sensitivity of the light-sensitive means. Namely, the instant method is free from a change in the environmental or operating temperature of the apparatus, and chronological changes in the characteristics of the light source device and light-sensitive means, thus permitting improved accuracy and consistency of measurement of the strength of the AC magnetic field and the corresponding amount of electric current.

Further, the instant method minimizes a possibility of a drift of the calibration zero point of the quantity to be measured.

It will thus be understood that the instant method of the invention permits accurate measurement with a relatively simple apparatus using a magnetooptical element formed of a Faraday-effect material which has a certain degree of temperature dependence. In this respect, the method according to the invention is industrially significant.

In one form of the invention, the strength of the AC magnetic field may be determined by dividing the second component ($E_{2\omega}$) by the first component ($E_\omega$).

The instant method may further comprise a step of regulating an amount of the light beam produced by the light source device so that the first component ($E_\omega$) is held constant In this case, the strength of the AC magnetic field is determined by the second component ($E_{2\omega}$) relative to the constant first component ($E_\omega$). For instance, the light source device includes a light-emitting element for producing the light beam, and a driver circuit for driving the light-emitting element In this case, the driver circuit is controlled in a feedback manner based on the first component ($E_\omega$) of the electric signal as produced by the light-sensitive means.

According to another aspect of the present invention, there is provided an apparatus for optically measuring the strength of an AC magnetic field, which includes a magnetooptical sensing head having at least a magnetooptical element, a polarizer and an analyzer, a light source device for producing a light beam to which the sensing head is exposed, and light-sensitive means for converting an optical output of the sensing head into an electric signal, the light beam being modulated into the optical output by the sensing head, according to the strength of the AC magnetic field to which the magnetooptical element is exposed, the apparatus comprising: (a) magnetic-field generating means for exposing the magnetooptical element of the sensing head to a reference magnetic field different from the AC magnetic field, to thereby bias the light beam while the light beam is transmitted through the magnetooptical element; (b) first-component retrieving means for retrieving a first component ($E_\omega$) of the electric signal which is produced by the light-sensitive means, the first component ($E_\omega$) having a same angular frequency as that of the AC magnetic field; (c) second-component retrieving means for retrieving a second component ($E_{2\omega}$) of the electric signal which has an angular frequency which is two times that of the AC magnetic field; and (d) means for determining the strength of the AC magnetic field, based on the first and second components ($E_\omega$) and ($E_{2\omega}$).

The determination of the strength of the AC magnetic field may be accomplished by a dividing circuit, which obtains the output of the apparatus by dividing the second component ($E_{2\omega}$) by the first component ($E_\omega$).

The magnetic-field generating means may be a solenoid coil winding disposed so as to surround the magnetooptical element of the sensing head.

According to a further aspect of the invention, there is provided an apparatus for optically measuring the strength of an AC magnetic field, which includes a magnetooptical sensing head having at least a magnetooptical element, a polarizer and an analyzer, a light source device for producing a light beam to which the sensing head is exposed, and light-sensitive means for converting an optical output of the sensing head into an electric signal, the light beam being modulated into the optical output by the sensing head, according to the strength of the AC magnetic field to which the magnetooptical element is exposed, the apparatus comprising: (a) magnetic-field generating means for exposing the magnetooptical element of the sensing head to a reference magnetic field different from the AC magnetic field, to thereby bias the light beam while the light beam is transmitted through the magnetooptical element; (b) first-component retrieving means for retrieving a first component ($E_\omega$) of the electric signal which is produced by the light-sensitive means, the first component ($E_\omega$) having a same angular frequency as that of the AC magnetic field; (c) second-component retrieving means for retrieving a second component ($E_{2\omega}$) of the electric signal which has an angular frequency which is two times that of the AC magnetic field; (d) feedback regulating means for regulating an amount of the light beam produced by the light source device so that the first component ($E_\omega$) is held constant; and (e) means for determining the strength of the AC magnetic field based on the second component ($E_{2\omega}$) relative to the constant first component ($E_\omega$).

The light source device may include a light-emitting element for producing the light beam, and a driver circuit for driving the light-emitting element. In this case, the feedback regulating means may include a regulating circuit for controlling the driver circuit in a feedback manner based on the first component ($E_\omega$) of the electric signal as produced by the light-sensitive means.

BRIEF DESCRIPTION OF THE DRAWINGS

The above and other objects, features and advantages of the invention will become apparent by reading the following detailed description of presently preferred embodiments of the invention, when considered in connection with the accompanying drawings, in which.

DETAILED DESCRIPTION OF THE PREFERRED EMBODIMENTS

Figure 1:
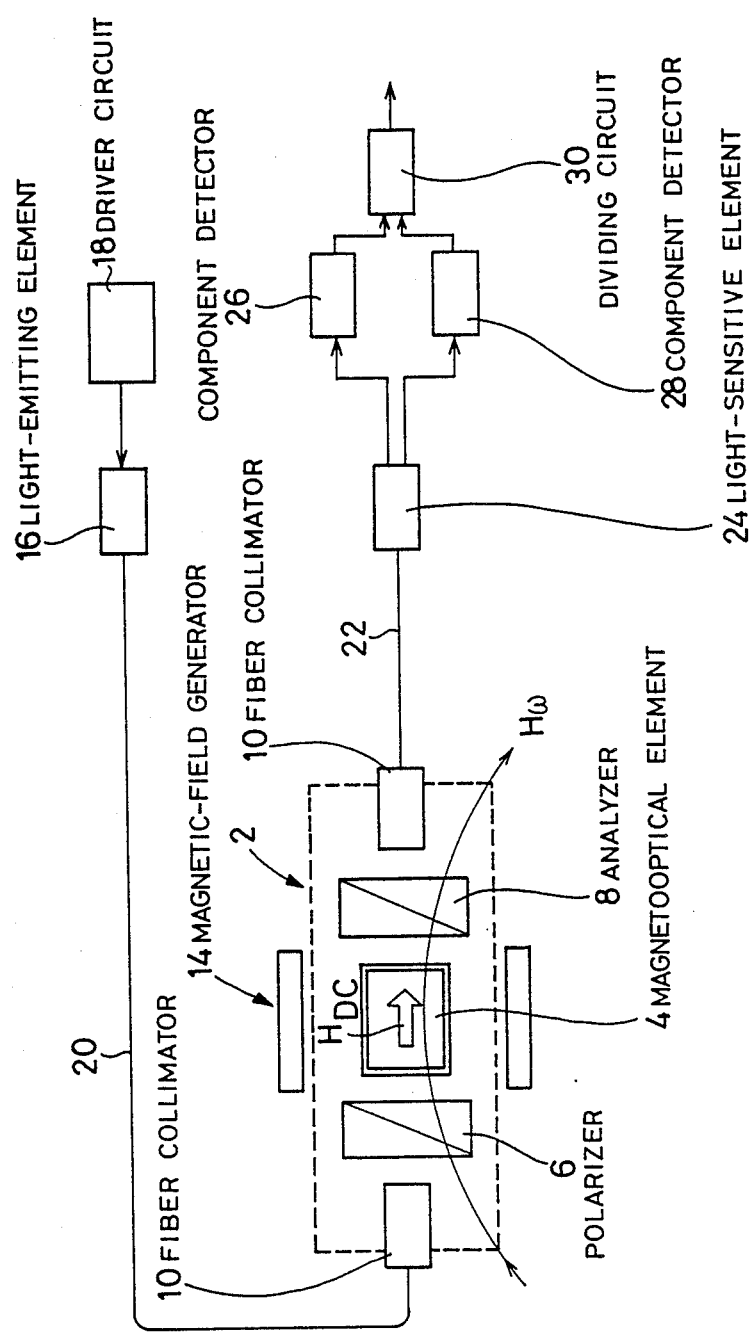
FIGS. 1 and 2 are schematic illustrations showing different embodiments of the present invention.

Referring first to FIG. 1, reference numeral 2 designates a magnetooptical sensing head of an apparatus adapted to optically detect or measure the amount of an electric current flowing through an electrically conductive material, and/or the strength of a magnetic field produced by the electric current As is well known in the art, the sensing head 2 includes a magnetooptical or Faraday-effect element 4, a polarizer 6 and an analyzer 8 which are disposed on opposite sides of the magnetooptical element 4, and two fiber collimators 10, 10 disposed outwardly of the polarizer and analyzer 6, 8. These elements 4, 6, 8, 10 are arranged along an optical path of the sensing head 2. The magnetooptical element 4 is exposed to an AC magnetic field $H_\omega$ produced by an electric power line (conductor) 12 made of an electrically conductive material Further, the magnetooptical element 4 is surrounded by a magnetic-field generator 14 in the form of a solenoid coil winding, whereby the magnetooptical element 4 may be exposed to a reference magnetic field $H_{DC}$ different from the AC magnetic field $H\omega$. The strength of this reference magnetic field $H_{DC}$ is maintained at a predetermined constant level.

The magnetooptical sensing head 2 is optically coupled by an optical fiber 20 with a light source device which includes a light-emitting element 16 for producing a suitable amount of light, and a driver circuit 18 for driving the light-emitting element 16 A light beam emitted from the light-emitting element 16 and propagated through the optical fiber 20 is incident upon the incoming fiber collimator 10 of the sensing head 2.

The light beam which has been transmitted through the sensing head 2 is emitted as an optical output from the outgoing fiber collimator 10, and is transmitted through an optical fiber 22 to a light-sensitive element 24, which converts the optical output of the sensing head 2 into an electric signal corresponding to the incident optical signal.

The electric signal output of the light-sensitive element 24 is received by a first component detector 26 and a second component detector 28, which apply respective angular frequency components of the received electric signal, to a dividing circuit 30. More specifically, the first component detector 26 serves as first-component retrieving means for selecting or retrieving a first component ($E\omega$) of the received electric signal which has the same angular frequency as that of the AC magnetic field $H\omega$, while the second component detector 28 serves as second-component retrieving means for selecting or retrieving a second component ($E_{2\omega}$) of the electric signal whose angular frequency is two times that of the AC magnetic field $H\omega$. These first and second components ($E\omega$) and ($E_{2\omega}$) obtained from the first and second component detectors 26, 28 are processed such that the second component ($E_{2\omega}$) is divided by the first component ($E\omega$). An output of the dividing circuit 30 is used as an output of the instant measuring apparatus.

As described above, the light beam generated by the light-emitting element 16 and transmitted through the optical fiber 20 is transmitted through the magnetooptical sensing head 2 and received by the light-sensitive element 24. During transmission through the sensing head 2, the light beam is modulated according to the strengths of the magnetic fields ($H\omega$, $H_{DC}$) in which the magnetooptical element is placed. Described more specifically, the light beam modulated by the AC magnetic field $H\omega$ is biased by the reference magnetic field $H_{DC}$. Where the polarizer 6 and the analyzer 8 are arranged in the form of a Nicol prism wherein the polarizer 6 and analyzer 8 have mutually perpendicular planes of incidence, a voltage E into which the optical output of the sensing head 2 is converted by the light-sensitive element 24 is represented by the following formula (1), as well known in the art:

$$E = kI_o \sin^2(a \sin\omega t + \theta) \quad (1)$$

where,
$I_o$ is the amount of light produced by element 16
$k$ is the sensitivity constant of element 24
$a$ is the amplitude of AC Faraday rotation angle by magnetic field $H\omega$
$\theta$ is the Faraday rotation angle due to reference magnetic field $H_{DC}$ The value $a$ is represented by the following formula (2):

$$a = cV_e H\omega L \quad (2)$$

where,
$c$ is the geometrical factor (approximate to 1)
$V_e$ is the Verdet's constant
$H\omega$ is the AC magnetic field caused by conductor 12
L is the length of magnetooptical element 4

The Faraday rotation angle $\theta$ is represented by the following formula (3):

$$\theta = dV_e H_{DC} L \quad (3)$$

where,
d is the geometrical factor (approximate to 1)

The following formula (4) is satisfied when the reference magnetic field $H_{DC}$ is produced by energization of the solenoid coil winding of magnetic field generator 14:

$$H_{DC} = Ni/L \quad (4)$$

where,
N is the number of turns of the winding (14)
i is the electric current applied to the winding (14)
L is the length of the winding (14)

The formula (1) is converted into the following formula (5), by using the Bessel function:

$$\begin{aligned} E &= \tfrac{1}{2}kI_o[1 - \cos(2a\sin\omega t + 2\theta)] \\ &= \tfrac{1}{2}kI_o[1 - \cos(2a\sin\omega t)\cos 2\theta + \sin(2a\sin\omega t)\sin 2\theta] \\ &= \tfrac{1}{2}kI_o \{1 - [J_0(2a) + 2J_2(2a)\cos 2\omega t + 2J_4(2a)\cos 4\omega t + \ldots]\cos 2\theta + [2J_1(2a)\sin\omega t + 2J_3(2a)\sin 3\omega t + \ldots]\sin 2\theta\} \end{aligned} \quad (5)$$

where, $J_1$–$J_4$ are the Bessel functions.

A quotient $E_{2\omega}/E\omega$ obtained by dividing the second component $E_{2\omega}$ by the first component $E\omega$ is represented by the following formula:

$$\begin{aligned} E_{2\omega}/E\omega &= \frac{J_2(2a)\cos 2\theta}{J_1(2a)\sin 2\theta} \\ &= \frac{\tfrac{1}{2}a^2(1-\tfrac{1}{3}a^2)}{a(1-\tfrac{1}{2}a^2)} \cdot \frac{1 - \tfrac{1}{2}(2\theta)^2}{2\theta[1 - 1/6(2\theta)^2]} \\ &= \frac{a}{4\theta}(1 + 1/6a^2 - 4/3\theta^2) \end{aligned} \quad (6)$$

Where the value $a$ is 4.4° or smaller and the value $\theta$ is 1.6° or smaller, the values of $1/6a^2$ and $4/3\theta^2$ are both as small as 1/1000. Since the magnetic field $H\omega$ to be measured is relatively small, the values may be further reduced to a negligible level, by adjusting the reference magnetic field $H_{DC}$, and the lengths L of the element 4 and winding 14. Therefore, the formula (6) may be expressed by the following formula (7):

$$E_{2\omega}/E\omega = a/4\theta \quad (7)$$

The formula (7) is converted into the following formula (8), by substituting the formulas (2), (3) and (4) for the appropriate values in the formula (7):

$$E_{2\omega}/E_\omega = \frac{cV_e H_\omega L}{4dV_e Ni} = \frac{cL}{4dNi} H_\omega \qquad (8)$$

It will thus be understood that the value $E_{2\omega}/E_\omega$ is proportional to the value $H_\omega$, and does not depend upon the Verdet's constant Ve, amount Io of light produced by the light-emitting element 16 and sensitivity constant k of the light-sensitive element 24. Since the electric current i in the formula (8) is obtained from a constant current generating circuit and is held constant, a proportional factor in the formula (8) is constant.

The output represented by the formula (8) depends upon neither the temperature dependence of the magnetooptical element 4 (Verdet's constant Ve), nor the changes in the characteristics of the light-emitting and light-sensitive elements 16, 24. Thus, it will be understood that the output of the instant apparatus is sufficiently consistent with the magnetic field $H_\omega$ or the corresponding current flowing through the conductor 12, which is to be measured according to the formula (8). In other words, a change in the operating environments of the apparatus will not significantly influence the output of the magnetooptical element 4, nor will chronological changes in the light amount Io and/or sensitivity constant k of the light-emitting and light-sensitive elements 16, 24 significantly influence the value of strength of the AC magnetic field $H_\omega$ as measured or detected by the instant measuring apparatus.

Figure 2:
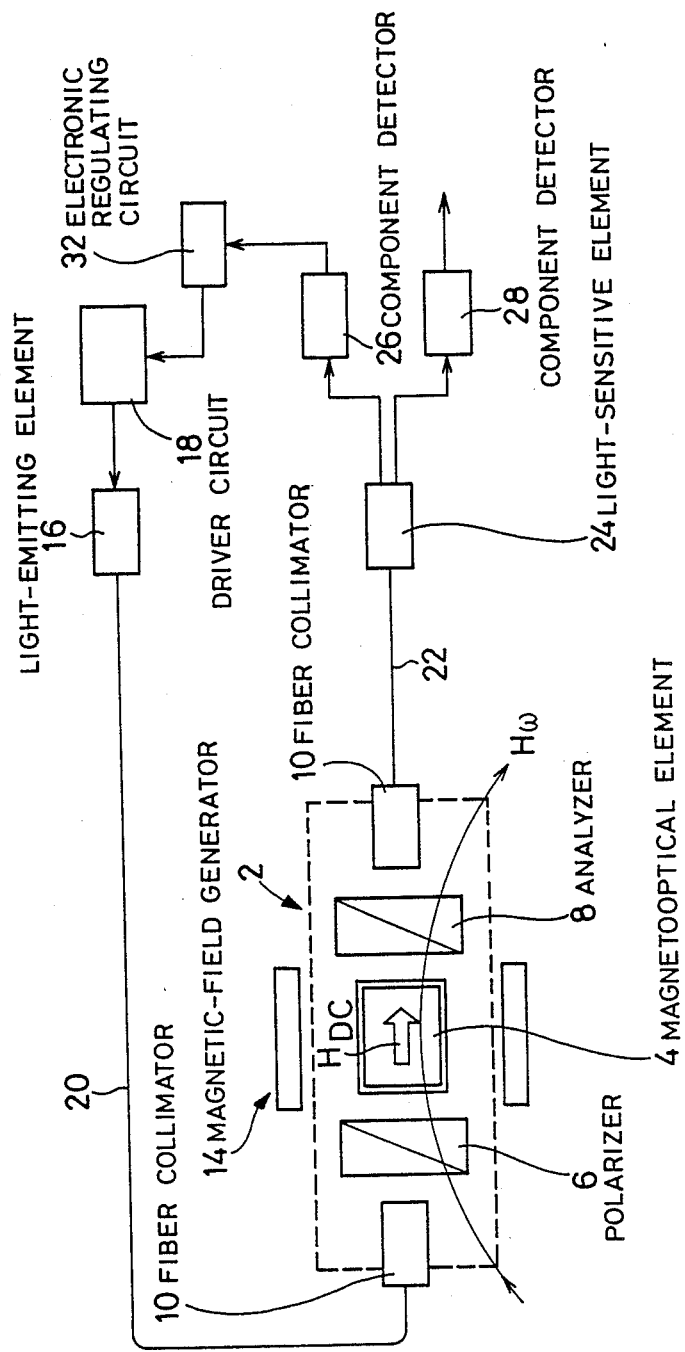

Referring next to FIG. 2, there is illustrated a modified embodiment of the measuring apparatus of the invention. In this modified embodiment, an electronic regulating circuit 32 is provided for regulating the amount of light produced by the light-emitting element 16. More specifically, the regulating circuit 32 is adapted to receive the output of the first component detector 26 and control the driver circuit 18 in a feedback manner, for regulating the optical output Io of the element 16 so that the first component $E_\omega$ of the electric signal received by the first component detector 26 whose angular frequency is equal to that of the AC magnetic field $H_\omega$ is made constant. That is, the output of the first component detector 26 is fed back to the driver circuit 18 for the light-emitting element 16, through a feedback control means 32, so that the first component E is held at a constant level.

In the instant embodiment, the first component $E_\omega$, i.e., ($\frac{1}{2}$)kIo x $J_1(2a)$ sin$2\theta_0$ is held constant by controlling the optical output Io of the element 16 by the feedback regulating circuit 32, while the second component $E_{2\omega}$, i.e., ($\frac{1}{2}$)kIo x $J_2(2a)$ cos$2\theta$ is used as the output of the measuring apparatus. In this case, the electronic circuit arrangement for measuring the strength of the AC magnetic field $H_\omega$ can be relatively simplified.

While the two presently preferred embodiments of the invention have been described for illustrative purposes only, to clarify the principle of the invention for assuring accurate and reliable measurement of an electric current or magnetic field strength without being influenced by the environmental or chronological changes of the apparatus, it will be understood that the invention is not limited to the details of the illustrated embodiments, but may be embodied with various changes, modifications and improvements, which may occur to those skilled in the art, without departing from the spirit and scope of the invention defined in the appended claims.

For example, the reference magnetic field $H_{DC}$ may be produced by suitable means such as a permanent magnet, other than the solenoid coil winding (14), provided that the reference magnetic field $H_{DC}$ produced does not fluctuate due to a change in the operating temperature. Where the solenoid coil winding is used, the winding should be energized by a constant current produced by a suitable constant-current generating device. This device may be powered by a current transformer (CT) connected to the electric conductor 12.

The first and second components $E_\omega$ and $E_{2\omega}$ of the electric signal produced by the light-sensitive element 24 may be retrieved by using a bandpass filter or a phase detecting circuit, such that the circuit is synchronized with a power source line. Further, the first and second component detectors 26, 28 and the dividing circuit 30 may be constituted by a single electronic circuit.

It will also be noted that various known materials such as YIG, paramagnetic glass and lead glass may be used for the magnetooptical element 4 of the sensing head 2.

What is claimed is:

1. A method of optically measuring the strength of an AC magnetic field, by a measuring apparatus which includes a magnetooptical sensing head having at least a magnetooptical element, a polarizer and an analyzer, a light source device for producing a light beam to which the sensing head is exposed, and light-sensitive means for converting an optical output of the sensing head into an electric signal, said light beam being modulated into said optical output by the sensing head, according to the strength of said AC magnetic field to which said magnetooptical element is exposed, said method comprising the steps of:

directing said light beam from said light source device through said polarizer, said magnetooptical element and said analyzer, so that a plane of polarization of said light beam from said polarizer is rotated according to a variation in the strength of said AC magnetic field, and such that an angle of rotation of said plane of polarization is converted by said analyzer into an optical intensity signal as said optical output of the sensing head;

exposing said magnetooptical element to a reference magnetic field different from said AC magnetic field, to thereby bias said light beam while said light beam is transmitted through said magnetooptical element;

directing said optical intensity signal to said light-sensitive means, which said light sensitive means converts said optical intensity signal into said electric signal;

retrieving a first component ($E_\omega$) and a second component ($E_{2\omega}$) of said electric signal which is produced by said light-sensitive means, said first component ($E_\omega$) having a same angular frequency as that of said AC magnetic field, while said second component ($E_{2\omega}$) having an angular frequency which is two times that of said AC magnetic field; and determining the strength of said AC magnetic field, based on said first and second components ($E_\omega$) and ($E_{2\omega}$).

2. A method according to claim 1, wherein said step of determining the strength of said AC magnetic field based on said first and second components ($E_\omega$) and ($E_{2\omega}$) comprises dividing said second component ($E_{2\omega}$) by said first component ($E_\omega$).

3. A method according to claim 1, further comprising a step of regulating an amount of said light beam produced by said light source device so that said first component ($E\omega$) is held constant, and wherein said step of determining the strength of said AC magnetic field based on said first and second components ($E\omega$) and ($E_2\omega$) comprises determining the strength of said AC magnetic field by said second component ($E_2\omega$) relative to the constant first component ($E\omega$).

4. A method according to claim 3, wherein said light source device includes a light-emitting element for producing said light beam, and a driver circuit for driving said light-emitting element, said step of regulating the amount of said light beam comprising controlling said driver circuit in a feedback manner based on said first component ($E\omega$) of said electric signal as produced by said light-sensitive means.

5. An apparatus for optically measuring the strength of an AC magnetic field, which includes a magnetooptical sensing head having at least a magnetooptical element, a polarizer and an analyzer, a light source device for producing a light beam to which the sensing head is exposed, and light-sensitive means for converting an optical output of the sensing head into an electric signal, said light beam being modulated into said optical output by the sensing head, according to the strength of said AC magnetic field to which said magnetooptical element is exposed, said apparatus comprising:

first optical guide means for directing said light beam from said light source device through said polarizer, said magnetooptical element and said analyzer, so that a plane of polarization of said light beam from said polarizer is rotated according to a variation in the strength of said AC magnetic field, and such that an angle of rotation of said plane of polarization is converted by said analyzer into an optical intensity signal as said optical output of the sensing head;

magnetic-field generating means for exposing said magnetooptical element to a reference magnetic field different from said AC magnetic field, to thereby bias said light beam while said light beam is transmitted through said magnetooptical element;

second optical guide means for directing said optical intensity signal to said light-sensitive means, which said light sensitive means converts said optical intensity signal into said electric signal;

first-component retrieving means for retrieving a first component ($E\omega$) of said electric signal which is produced by said light-sensitive means, said first component ($E\omega$) having a same angular frequency as that of said AC magnetic field;

second-component retrieving means for retrieving a second component ($E_2\omega$) of said electric signal which has an angular frequency which is two times that of said AC magnetic field; and means for determining the strength of said AC magnetic field, based on said first and second components ($E\omega$) and ($E_2\omega$).

6. An apparatus according to claim 5, wherein said means for determining the strength of said AC magnetic field comprises a dividing circuit for dividing said second component ($E_2\omega$) by said first component ($E\omega$).

7. An apparatus according to claim 5, wherein said magnetic-field generating means comprises a solenoid coil winding which surrounds said magnetooptical element of said sensing head.

8. An apparatus for optically measuring the strength of an AC magnetic field, which includes a magnetooptical sensing head having at least a magnetooptical element, a polarizer and an analyzer, a light source for producing a light beam to which the sensing head is exposed, and light-sensitive means for converting an optical output of the sensing head into an electric signal, said light beam being modulated into said optical output by the sensing head, according to the strength of said AC magnetic field to which said magnetooptical element is exposed, said apparatus comprising:

first optical guide means for directing said light beam from said light source device through said polarizer, said magnetooptical element and said analyzer, so that a plane of polarization of said light beam from said polarizer is rotated according to a variation in the strength of said AC magnetic field, and such that an angle of rotation of said plane of polarization is converted by said analyzer into an optical intensity signal as said optical output of the sensing head;

magnetic-field generating means for exposing said magnetooptical element to a reference magnetic field different from said AC magnetic field, to thereby bias said light beam while said light beam is transmitted through said magnetooptical element;

second optical guide means for directing said optical intensity signal to said light-sensitive means, which said light sensitive means converts said optical intensity signal into said electric signal;

first-component retrieving means for retrieving a first component ($E\omega$) of said electric signal which is produced by said light-sensitive means, said first component ($E\omega$) having a same angular frequency as that of said AC magnetic field;

second-component retrieving means for retrieving a second component ($E_2\omega$) of said electrical signal which has an angular frequency which is two times that of said AC magnetic field;

feedback regulating means for regulating an amount of said light beam produced by said light source device so that said first component ($E\omega$) is held constant; and means for determining the strength of said AC magnetic field, based on said second component ($E_2\omega$) relative to the constant first component ($E\omega$).

9. An apparatus according to claim 8, wherein said light source device includes a light-emitting element for producing said light beam, and a driver circuit for driving said light-emitting element, said feedback regulating means comprising a regulating circuit for controlling said driver circuit in a feedback manner based on said first component ($E\omega$) of said electric signal as produced by said light-sensitive means.

10. The apparatus of claim 5, wherein said first optical guide means comprises an optical fiber for optically coupling said light source device and said polarizer, while said second optical guide means comprises an optical fiber for optically coupling said analyzer and said light-sensitive means.

11. The apparatus of claim 8, wherein said first optical guide means comprises an optical fiber for optically coupling said light source device and said polarizer, while said second optical guide means comprises an optical fiber for optically coupling said analyzer and said light-sensitive means.

* * * * *